(12) United States Patent
Yamada

(10) Patent No.: US 6,916,184 B2
(45) Date of Patent: Jul. 12, 2005

(54) ELECTRICAL CONNECTOR HOUSING

(75) Inventor: Tatsuya Yamada, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 10/826,403

(22) Filed: Apr. 19, 2004

(65) Prior Publication Data
US 2004/0235318 A1 Nov. 25, 2004

(30) Foreign Application Priority Data
Apr. 25, 2003 (JP) .......................... 2003-122598

(51) Int. Cl.⁷ .............................................. H01R 12/00
(52) U.S. Cl. ................... 439/76.2; 439/949; 174/50; 174/52.1; 174/59; 361/752; 361/775; 361/643; 361/648
(58) Field of Search ............................. 439/76.2, 949; 174/50, 52.1, 59; 361/752, 736, 775, 641–643, 648

(56) References Cited

U.S. PATENT DOCUMENTS

| 5,478,244 | A | * | 12/1995 | Maue et al. | ............... 439/76.2 |
| 5,764,487 | A | * | 6/1998 | Natsume | ....................... 361/775 |
| 5,928,004 | A | * | 7/1999 | Sumida et al. | ............. 439/76.2 |
| 6,325,642 | B2 | * | 12/2001 | Asao | ........................ 439/76.2 |
| 6,430,055 | B2 | * | 8/2002 | Saito | ......................... 361/752 |
| 6,494,723 | B2 | | 12/2002 | Yamane et al. | |
| 6,506,060 | B2 | * | 1/2003 | Sumida et al. | ............. 439/76.2 |
| 6,524,113 | B1 | * | 2/2003 | Oka | ............................ 439/48 |
| 6,541,700 | B2 | * | 4/2003 | Chiriku et al. | ................ 174/50 |
| 6,634,892 | B2 | * | 10/2003 | Nakamura | ................. 439/76.2 |
| 6,655,967 | B2 | * | 12/2003 | Oda | .......................... 439/76.2 |
| 6,672,883 | B2 | * | 1/2004 | Kasai et al. | ............... 439/76.2 |
| 6,677,521 | B2 | * | 1/2004 | Sumida et al. | ................ 174/50 |
| 6,761,567 | B2 | * | 7/2004 | Onizuka et al. | ........... 439/76.2 |
| 6,814,591 | B2 | * | 11/2004 | Oka et al. | .................. 439/76.2 |
| 6,835,073 | B2 | * | 12/2004 | Kobayashi | ................. 439/76.2 |

FOREIGN PATENT DOCUMENTS

| JP | U 6-50221 | 7/1994 |
| JP | A 2001-319708 | 11/2001 |

* cited by examiner

*Primary Examiner*—Gary Paumen
(74) *Attorney, Agent, or Firm*—Oliff & Berridge, PLC

(57) ABSTRACT

The electrical connector housing contains a power distributor panel including a printed circuit board, one face of which carries conductors and semiconductor switching elements and the other face of which is adhered with a busbar. The electrical connector housing further contains a laminated-busbar unit connected to a power source circuit. A first tab is formed from one end of the busbar fixed to the power distributor panel, or by welding with the conductors, and is protruded beyond a first sidewall of the power distributor panel, while a second tab is formed from a busbar extending from the laminated-busbar unit. These tabs are connected by a relay system. The electrical connector housing thus manufactured can be assembled efficiently, its maintenance is easy, and the semiconductor switching elements used therein can be replaced easily.

19 Claims, 4 Drawing Sheets

ELECTRICAL CONNECTOR HOUSING

CLAIM FOR PRIORITY

The present disclosure relates to subject-matter contained in and claims priority to Japanese Application No. 2003-122598, filed on Apr. 25, 2003, which is herein expressly incorporated by reference in its entirety.

BACKGROUND OF THE INVENTION

1. Field of Invention

The present invention relates to an electrical connector housing, and more particularly to an electrical connector housing containing a power distributor "PD" panel that comprises a printed circuit board carrying semiconductor switching elements. One of the objects of the invention is to facilitate the maintenance of electrical connector housings.

2. Description of Related Art

Known electrical connector housings, such as junction boxes for onboard applications, e.g., in cars or other vehicles, carry a number of relays and fuses, and contain numerous connector-fitting members for linking busbars to wire harnesses.

Recently, as vehicles have begun to use an increased number of items of electrical equipment and electrical circuit systems, the number of relays implemented in the latter has also increased correspondingly. As a result, electrical connector housings have to lodge an increased number of parts and their size tends to increase.

In the face of such problems, recent developments have led to an electrical connector housing integrating a power distributor "PD" panel, in which the busbar and printed circuit board assembly are equipped with FET (field effect transistor) type semiconductor switching elements to replace mechanical relays. As the semiconductor switching elements are smaller and lighter than the conventional mechanical relays they replace, an electrical connector housing using such elements can be miniaturized considerably.

An example of such an electrical connector housing is disclosed, e.g., in JP-A-2001-319708, according to which the housing contains a power distributor portion equipped with semiconductor switching elements. The housing also includes busbars with which insulating sheets are interposed, and the terminals in the power distributor portion and the busbars are connected by overlapping and welding.

However, because the connections are made by welding, when the semiconductor switching elements are to be replaced for maintenance, the power distributor panel alone cannot be removed from the housing. It is also difficult to deal with changes, either when fuses are used in the link portion between the circuit in the power distributor panel and the busbar circuit at the power-source side, or when fuses are at the busbar circuit side. Further, as the power distributor portion is integrated with the busbars, its installation is not easy.

SUMMARY OF THE INVENTION

The present invention aims to solve such problems, and to provide an electrical connector housing in which the power distributor portion can be replaced easily and operation changes can be dealt with easily by enabling the power distributor portion and the busbars to be separated.

To this end, there is provided an electrical connector housing containing a power distributor panel having first and second sidewalls and at least one unit including laminated busbars connected to a power source circuit. The power distributor panel comprises a printed circuit board with first and second faces, the first face including conductors and at least one semiconductor switching element, while the second face comprises at least one busbar fixed thereto. There are further provided a first connecting portion and a second connecting portion, such that the first and second connecting portions can be electrically connected via a relay system.

Preferably, the first connecting portion comprises at least one first tab connected to the busbar fixed to the second face of the printed circuit board and extending beyond the first sidewall of the power distributor panel.

Alternatively, the first connecting portion may comprise at least one first tab welded to the conductors and extending beyond the first sidewall of the power distributor panel. Typically, the second connecting portion comprises at least one second tab connected to the unit including laminated busbars.

Suitably, the electrical connector housing comprises a first shell including a fuse-receiving unit, and a second shell. The relay system can comprise a first relay terminal to which the second tab is connected, and a relay busbar one end of which is connected to the relay terminal and the other end of which forms at least one third tab. The first and third tabs can then be placed in the fuse-receiving unit such that the first tab and the third tab can be electrically connected by placing a fuse.

Alternatively, the relay system may comprise a second relay terminal having first and second sections, such that the first tab and the second tab can be electrically connected by engaging the first tab with the first section and the second tab with the second section, respectively.

Typically, the first and second sections of the second relay terminal comprise a press-fit portion.

Typically yet, the electrical connector housing comprises a first shell and a second shell, the first shell comprises an internal face carrying a terminal-fixing unit and the second relay terminal is fixed thereto.

Preferably, the housing comprises an axis along which the first shell and the second shell are superposed, and the power distributor panel has a substantially parallelepipedic shape and is arranged in the direction parallel to the axis, while the unit including laminated busbars has a substantially parallelepipedic shape and is arranged perpendicularly to the power distributor panel.

The invention also relates to a system for cabling a vehicle including an electrical connector housing containing a power distributor panel having first and second sidewalls and at least one unit including laminated busbars connected to a power source circuit. The power distributor panel comprises a printed circuit board with first and second faces, the first face including conductors and at least one semiconductor switching element, while the second face comprises at least one busbar fixed thereto. There are then provided a first connecting portion and a second connecting portion, such that the first and second connecting portions can be electrically connected via a relay system.

The invention further relates to a method for cabling a vehicle including the steps of:

preparing an electrical connector housing containing a power distributor panel having first and second sidewalls, and at least one unit including laminated busbars connected to a power source circuit;

providing the power distributor panel with a printed circuit board having first and second faces;

providing the first face with conductors and at least one semiconductor switching element, while providing the second face with at least one busbar fixed thereto; and providing a first connecting portion and a second connecting portion; whereby the first and second connecting portions can be electrically connected via a relay system.

As described above, the power distributor panel can be vertically arranged at one zone side of the electrical connector housing. Further, one side of the power distributor panel can be adhered to a heat-radiating plate which is exposed outwardly from the housing. On the other hand, the laminated-busbar unit can be arranged perpendicularly in relation to the power distributor panel at the other zone side of the housing. The tab extending from the unit including laminated busbars and the tab extending from the power distributor panel can then be connected by the relay system.

In the above structure, the power distributor panel and the laminated-busbar unit can be removed from the shells independently. Maintenance of the housing is thus made easier, and the connecting operation through the relay system is simpler than the connection by welding.

Further, it is easy to change the manner of operating, either with the fuse provided at the connection site between the power distributor panel and the laminated-busbar unit, or with the fuse provided at the busbar circuit side.

In the first case, the tab fixed to the power distributor panel is led out into the fuse-receiving unit that is formed on the internal face of the first shell. In this case, the relay system comprises a relay busbar and a first relay terminal. The tab fixed to the laminated-busbar unit leading to the power source circuit is connected to a first end of the relay busbar via the first relay terminal, and a second end of the relay busbar is led out into the fuse-receiving unit. The tab fixed to the power distributor panel and the second end of the relay busbar can be connected by a fuse installed in the fuse receiving unit.

In the second case, the tab leading to the power distributor panel is extended beyond the top rim of the panel, while the tab leading to the laminated busbar unit is bent and extended upwardly, and placed parallel to the first tab. The tabs placed in parallel are connected by a second relay terminal having a press-fit portion at both of its ends.

When the tab leading to the power distributor panel and the tab leading to the laminated-busbars unit are connected by a relay system, e.g., a first relay terminal or a second relay terminal, the arrangement site of the fuse can be modified easily, and the operational change can easily be dealt with.

Preferably, the second relay terminal is fixed to the terminal-fixing unit provided on the internal face of the first shell. The terminal-fixing unit can comprise, for instance, a frame-shaped member having grooves into which the relay terminal can fit, or a rib provided with slits into which the second relay terminal can be inserted. The terminal-fixing unit is typically formed saliently from the internal face of the first shell. Alternatively, the second relay terminal may comprise a locking claw, while the internal face of the shell may comprise a locking hole or frame to be hooked by the locking claw.

When the second relay terminal is fixed to the shell, there is no need to provide specifically a member for holding the second relay terminal. Furthermore, the fixing is simple and secure. Besides, when the shell fixed to the second relay terminal is removed, the tab extending from the power distributor panel and the tab extending from the laminated-busbar unit are disconnected. The maintenance of the power distributor panel or the laminated-busbar unit is thus further facilitated.

BRIEF DESCRIPTION OF THE DRAWINGS

The above, and the other objects, features and advantages of the present invention will be made apparent from the following description of the preferred embodiments, given purely as non-limiting examples, with reference to the accompanying drawings, in which.

DETAILED DESCRIPTION OF EXEMPLARY EMBODIMENTS

Figure 1A:
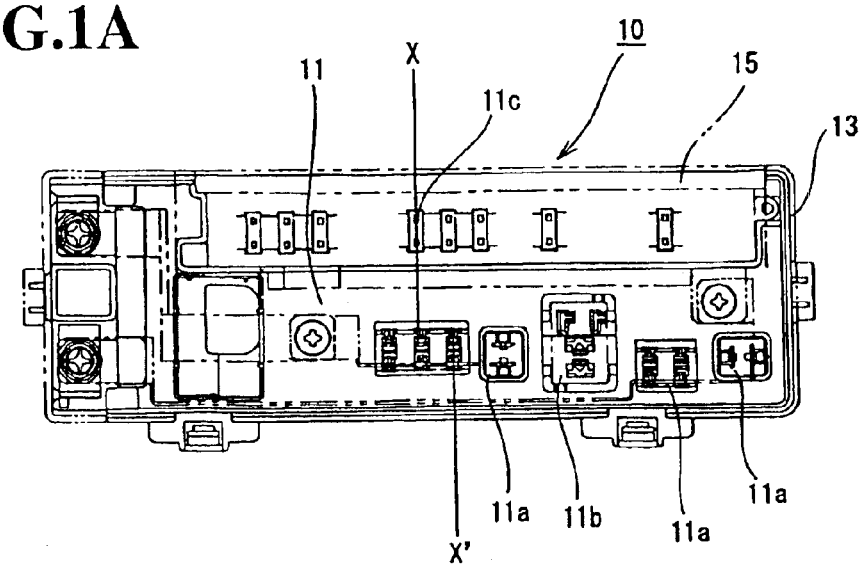
FIG. 1A is a top plan view of a first (e.g., upper) shell of the electrical connector housing according to a first embodiment of the invention.
Figure 1B:
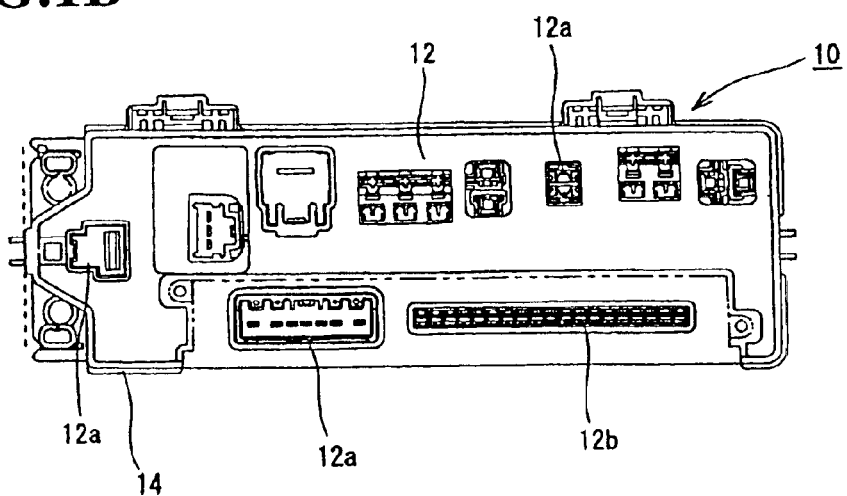
FIG. 1B is a top plan view of a second (e.g., lower) shell of the electrical connector housing according to the first embodiment of the invention.
Figure 2:
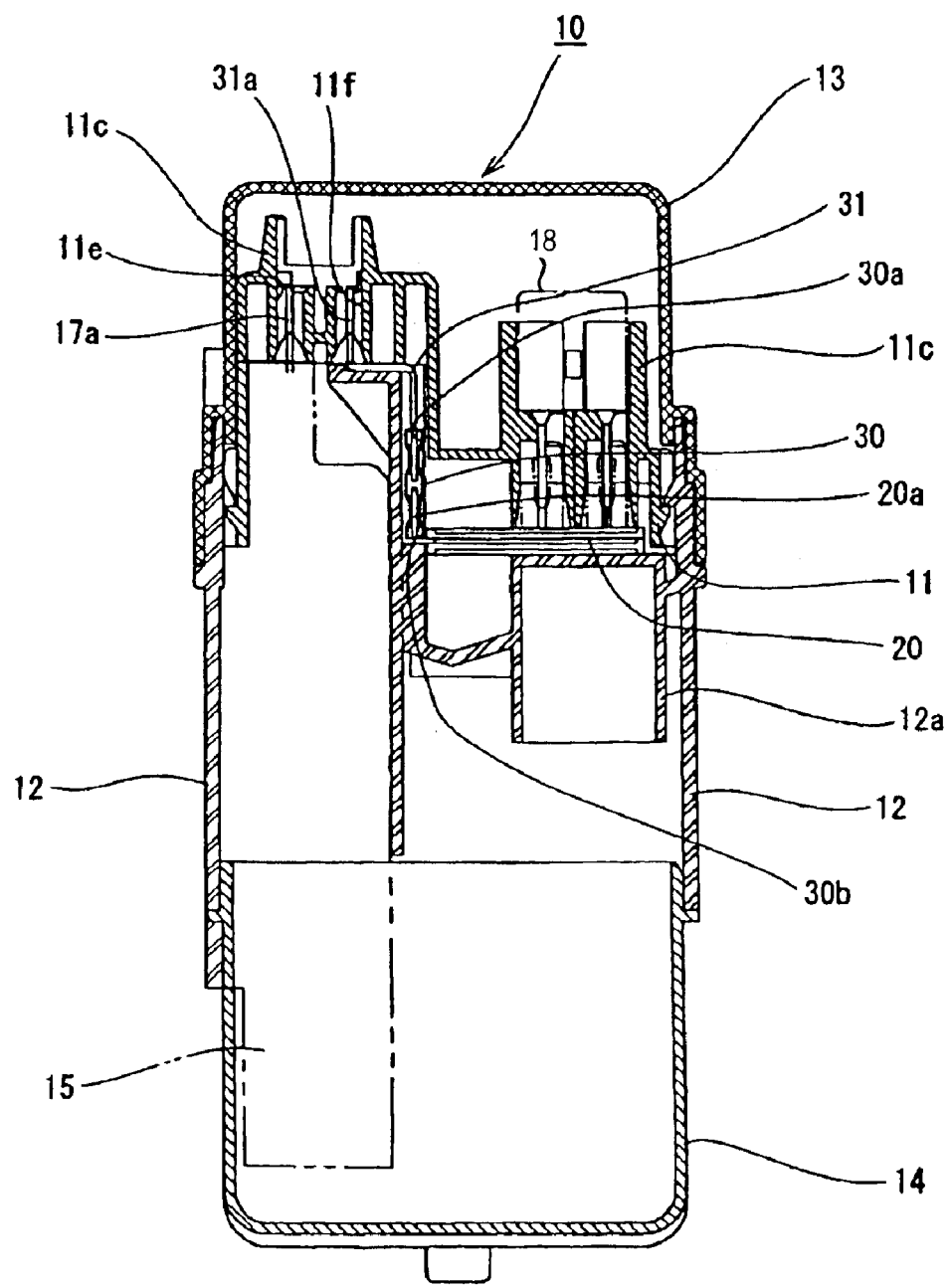
FIG. 2 is a side elevational view of the cross-section, taken along lines X–X' of the electrical connector housing of the first embodiment, when the first shell of FIG. 1A and the second shell of FIG. 1B are joined.

An electrical connector housing 10 according to the present invention is illustrated in FIGS. 1 and 2. It is composed of a first (e.g., upper) shell 11 and a second (e.g., lower) shell 12. Further, both shells 11 and 12 are housed, respectively, in a first (upper) cover 13 and a second (lower) cover 14, such that first (upper) and second (lower) openings can be closed.

As shown in FIG. 1A, the external face of the first shell 11 may be provided with a plurality of connector-receiving units 11a, relay-receiving units 11b and/or fuse-receiving units 11c. Similarly, as shown in FIG. 1B, the external face of the second shell 12 may be provided with a number of connector-receiving units 12a and fuse-receiving units 12b.

Figure 3:
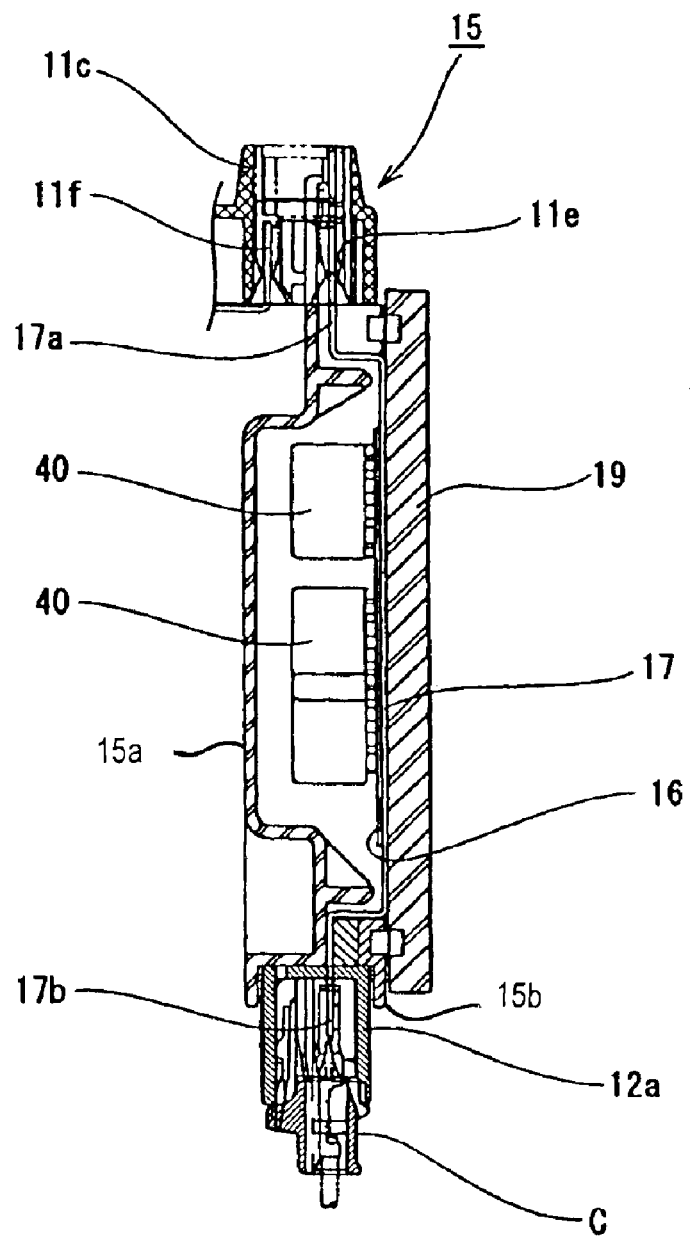
FIG. 3 is a partial cross-sectional view of the details of the power distributor panel shown by dots and lines in FIGS. 1 and 2.

The internal face of the first shell 11 comprises fuse receiving units 11c and, further underneath, a power distributor panel 15 arranged vertically, as shown in FIGS. 1 to 3. The power distribution panel 15 includes a first sidewall 15a and a second sidewall 15b to hold the connector receiving units 12a.

In the power distributor panel 15 shown in FIG. 3, a first face of a printed circuit board 16 is provided with printed conductors and further mounted with semiconductor switching elements 40, while a second face thereof is adhered to busbars 17, e.g., with an adhesive.

The terminals of the semiconductor switching elements 40 are electrically connected to the busbars 17 by soldering, via the conductors printed on the printed circuit board 16 and the through-holes pierced or drilled in the printed circuit board 16.

At least one of the busbars 17 terminates at parts 17a and 17b at either end portion. The length of the busbar 17 extends beyond the length of the first sidewall 15a. The end portion of one or several busbar(s) 17 is turned from a rim portion of the printed circuit board 16 and bent towards the first face of the printed circuit board 16 where the semiconductor switching elements 40 are mounted, so as to form one or several first tab(s).

Parts 17*a* of the first tabs (shown in the upper side of FIG. 3) protrude from underneath into either (e.g., 11*e*) of terminal holes 11*e* or 11*f* in a fuse-receiving unit 11*c* formed on the first shell 11.

Parts 17*b* of the first tabs (shown in the lower side of FIG. 3) protrude into a connector-receiving unit 12*a* formed on the second shell 12, and are connected to outside connectors C mounted therein.

An insulating plate is superposed on the face of the printed circuit board 16 where the busbars are mounted, and a heat-radiating plate 19 is superposed on that insulating plate and fixed thereto e.g., with an adhesive. The heat-radiating plate 19 comprises a number of heat-radiating fins made of highly radiative material, such as a highly heat-conductive metal. In the embodiment shown in FIG. 3, the length of the heat-radiating plate 19 corresponds approximately to the length of the first sidewall 15*a* of the power distributor panel 15.

In the electrical connector housing 10, a laminated-busbar unit 20 is arranged to confront the power distributor panel 15, as shown in FIG. 2. In the laminated-busbar unit 20, a plurality of busbars are laminated with insulating plates interposed, and the laminated-busbar unit 20 is connected to a power source circuit 18. The laminated-busbar unit 20 comprises a number of second tabs projecting therefrom. These second tabs are relayed into the connector-receiving units, fuse-receiving units and relay-receiving units provided in the first and second shells 11 and 12, and connected to connectors, fuses and relays therein.

In the laminated-busbar unit 20, the end portions of the busbars protrude towards the power distributor panel 15, and form second tabs 20*a*. These tabs are connected to corresponding first relay terminals 30 (e.g., female-to-female type) from beneath in FIG. 2. The first relay terminal 30 receives the bottom end portion of the corresponding relay busbar 31 from above in FIG. 2. The relay busbar 31 extends along that face of the power distributor panel, where the semiconductor switching elements 40 are mounted, and then bent twice, the top end portion thereof forming a third tab 31*a*. The first tab 17*a* and the third tab 31*a* protrude into the fuse-receiving unit 11*c* through a terminal hole 11*f*.

When a fuse is mounted in the fuse receiving unit 11*c*, the third tab 31*a* of the relay busbar 31 is connected to the first tab 17*a* of the busbar 17 fixed to the power distributor panel 15 through that fuse.

In the above case, if the terminal of the fuse is in the form of a press-fit slot, both tabs 31*a* and 17*a* can be connected merely by pushing. Alternatively, if the fuse terminal is in the form of a tab, the first relay terminal 30 can be mounted with the tabs 31*a* and 17*a* arranged in the fuse receiving unit 11*c* beforehand, and the fuse terminal is connected to this first relay terminal 30.

The relay busbar 31 is thus connected to the laminated-busbar unit 20 via the first relay terminal 30. Consequently, the laminated-busbar unit 20 is connected to the busbar 17 of the power distributor panel 15 via the fuse.

In accordance with a first embodiment of the electrical connector housing 10 of the invention, the fuse installation operation and the connection of the power distributor panel 15 to the laminated-busbar unit 20 can be performed simultaneously, so that the efficiency of connecting operations in the electrical connector housing can be greatly improved.

Further, the power distributor panel 15 and the laminated-busbar unit 20 can be connected by merely fitting the first and third tabs 17*a* and 31*a* to the fuse terminal, and by fitting the second tab 20*a* and the relay busbar 31 to the first relay terminal 30. Thus, not only the electrical connections can be made easily compared to the known welding or screwing method, but also the power distributor panel 15 can be separated from the laminated-busbar unit 20.

Further, as the light and thin semiconductor switching elements 40 are used as a relay means in the power distributor panel 15, the electrical connector housing 10 can be sized down and made lighter. In addition, as the fuse serves also as a connecting terminal between the power distributor panel 15 and the laminated-busbar unit 20, there is no need to provide a connecting site specifically for connections. The electrical connector housing 10 can thus be miniaturized further.

When the semiconductor switching elements 40 in the power distributor panel are to be replaced, or when the panel itself is to be replaced, the relay busbar 31 can be removed from the laminated-busbar unit 20 by simply its removal from the first relay terminal 30. In this manner, the power distributor panel 15 alone can be taken out from the electrical connector housing 10.

Figure 4A:
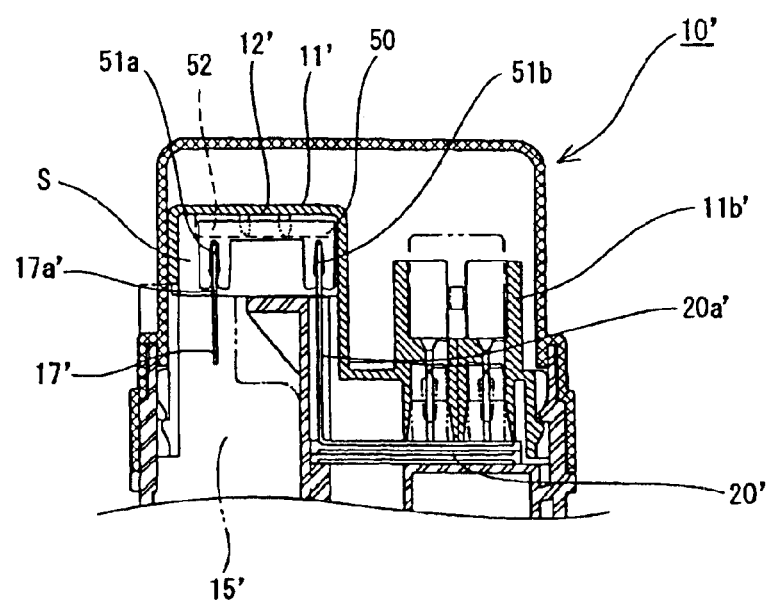
FIG. 4A is an elevational view of the cross-section of the main part of the electrical connector housing according to a second embodiment of the invention.

As a second embodiment of the invention, FIG. 4A gives an enlarged cross-sectional view of the main portion of the electrical connector housing 10', which contains a connecting structure between a power distributor panel 15' and a laminated-busbar unit 20', which structure is similar to that of the first embodiment of the invention.

The first tab 17*a*' of the busbar 17' in the power distributor panel 15' is made to protrude into a space S formed in the top part of the electrical connector housing 10'. Likewise, the second tab 20*a*' extending from the laminated-busbar unit 20' is arranged near, and parallel to, the first tab 17*a*' in that space S.

In the second embodiment of the invention, a fuse is not used in the circuit system of the electrical connector housing. Accordingly, by contrast with the first embodiment of the invention, the first (upper) shell of the electrical connector housing 10' does not comprise any fuse receiving unit. The second tab 20*a*' from the laminated-busbar unit 20' and the first tab 17*a*' from the busbar 17' of the power distributor panel 15' are therefore arranged in the space S, not in the fuse receiving unit as in the case of the first embodiment of the invention.

Also, the internal face of the first shell 11' may be provided with one or several second relay terminal(s) 50 projecting downwardly into the space S. The second relay terminal 50 is U-shaped, and made by stamping a metal piece out of an electrically conductive metal sheet and providing both ends of the piece with press-fit slots 51*a* and 51*b*. The second relay terminal 50 is press-fitted into the groove 52*a* of a terminal-fixing unit 52, which protrudes downwardly from the internal face of the first shell 11' into the space S.

Figure 4B:
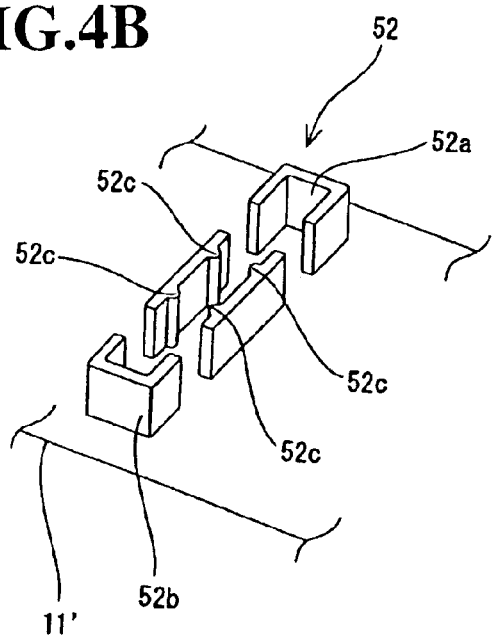
FIG. 4B is a perspective view of the terminal-fixing unit of the second relay terminal according to the second embodiment of the invention.

As shown in FIG. 4B, the terminal-fixing unit 52 is provided with a fixing frame 52*b* projecting from the internal face of the first shell 11', the fixing frame 52*b* including a channel 52*a* arranged in accordance with the size of the second relay terminal 50. The latter can then be fitted into the channel 52*a*. The inside of the channel 52*a* is provided with fixing ribs 52*c*.

Figure 4C:
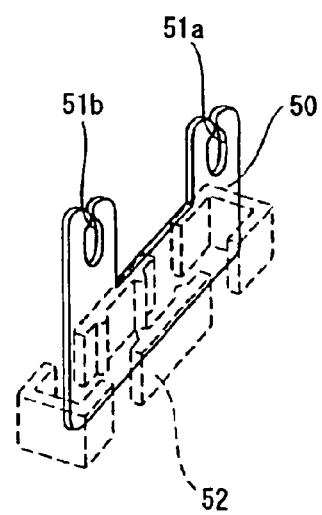
FIG. 4C is a perspective view of the second relay terminal of the second embodiment when it is fixed to the terminal-fixing unit.

As shown in FIG. 4C, the second relay terminal 50 is press-fitted into the channel 52*a* of the terminal-fixing unit 52, and is fixedly held by the fixing ribs 52*c*.

The tips of the first tab 17a' of the power distributor panel 15' and second tab 20a' of the laminated-busbar unit 20' are fitted into the press-fit slots 51a and 51b provided at both ends of the second relay terminal 50. The other constructions may be the same as those of the first embodiment of the invention.

In the second embodiment of the invention, the power distributor panel 15' and the laminated-busbar unit 20' are electrically connected via the second relay terminal 50 mounted on the first shell 11'.

As in the case of the first embodiment of the invention, the first tab 17a' of the power distributor panel 15' is press-fitted into the press-fit slots 51a and 51b of the second relay terminal 50 by a simple pushing action. Electrical connections between the power distributor panel 15' and the laminated-busbar unit 20' are thus made more easily. Further, when the power distributor panel 15' alone is to be replaced, it suffices to remove the first shell 11', the inside of which is fixed to the second relay terminal 50, so as to undo the connection of the second relay terminal 50 to the first tab 17a' and laminated-busbar unit 20'.

Also, the second relay terminal 50 and the means for connecting the power distributor panel 15' to the laminated-busbar unit 20' can be manufactured easily and at low cost by merely stamping a given shape of a piece from a metal sheet.

The terminal-fixing unit 52 is not limited to the construction shown in the second embodiment of the invention, but extends to e.g., a structure in which the internal face of the first shell comprises a protruding rib having slits, into which the second relay terminal 50 can be press-fitted. Alternatively, the second relay terminal 50 may be provided with locking claws, while the first shell may be provided with locking grooves or frames engageable with the locking claws. Alternatively yet, the second relay terminal may comprise locking holes, whereas the first shell may comprise locking claws, whereby the second relay terminal is locked with the first shell.

In the above embodiments, the first tab from the busbar of the power distributor panel is connected to the second tab from the laminated-busbar unit. Alternatively, the tab may be connected, by welding, to the printed conductors on the printed circuit board of a power distributor panel. The tab may then be made to protrude from the power distributor panel and to connect to the tab of the laminated-busbar unit via a relay terminal.

As is obvious from the foregoing, a power distributor panel is provided with a printed circuit board carrying semiconductor switching elements (FETs), while a laminated-busbar unit is arranged beside the power distributor panel. They are then connected via a relay terminal by fitting, instead of welding or screwing. By virtue of this configuration, the power distributor panel can be easily removed from the electrical connector housing, independently from the busbars, so that its maintenance can be done very easily.

Alternatively, the power distributor panel and the laminated-busbar unit may be connected via a fuse, or means other than the fuse. Thus, the connector can be alternated very easily.

Further, when relay terminals are used to connect the tabs of the power distributor panel and those of the laminated-busbar unit arranged in parallel, such relay terminals can be manufactured easily and at low cost, whereby production costs of the electrical connector housing are lowered.

In case where the relay terminal is fixed to the terminal-fixing unit provided on the first (upper) shell, the panel-side tabs and the busbar-side tabs can be connected by merely placing the first shell, and can be disconnected by its removal, in an easy and secure manner. Maintenance of the electrical connector housing becomes thus very easy.

The entire disclosure of Japanese Patent Application No. 2003-122598 filed on Apr. 25, 2003, including the specification, claims, drawings and summary, is incorporated herein by reference in its entirety and claimed for priority.

Although the invention has been described with reference to particular means, materials and embodiments, it is to be understood that the invention is not limited to the particulars disclosed and extends to all equivalents within the scope of the claims. It is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

What is claimed is:

1. An electrical connector housing comprising:
   a power distributor panel comprising first and second sidewalls, and a printed circuit board with first and second faces; and
   at least one unit comprising laminated busbars connected to a power source circuit,
   said first face comprising conductors and at least one semiconductor switching element,
   said second face comprising at least one busbar fixed thereto,
   wherein said at least one busbar connects to a first connecting portion and said at least one unit connects to a second connecting portion, said first and second connecting portions being electrically connectable via a relay system.

2. The electrical connector housing according to claim 1, wherein said first connecting portion comprises at least one first tab connected to said busbar fixed to said second face of said printed circuit board and extending beyond said first sidewall of said power distributor panel.

3. The electrical connector housing according to claim 1, wherein said first connecting portion comprises at least one first tab welded to said conductors and extending beyond said first sidewall of said power distributor panel.

4. The electrical connector housing according to claim 2, wherein said second connecting portion comprises at least one second tab connected to said unit comprising laminated busbars.

5. The electrical connector housing according to claim 3, wherein said second connecting portion comprises at least one second tab connected to said unit comprising laminated busbars.

6. The electrical connector housing according to claim 4, wherein
   said electrical connector housing comprises a first shell including a fuse-receiving unit, and a second shell,
   said relay system comprises a first relay terminal to connect with said second tab,
   a relay busbar is connected at one end to said relay terminal and the other end forming at least one third tab, and
   said first and third tabs are inserted in said fuse-receiving unit to electrically connect said first tab and said third tab by placing a fuse therebetween.

7. The electrical connector housing according to claim 5, wherein
said electrical connector housing comprises a first shell including a fuse-receiving unit, and a second shell,
said relay system comprises a first relay terminal to which said second tab is connected,
a relay busbar is connected at one end to said relay terminal and the other end forming at least one third tab, and
said first and third tabs are inserted in said fuse-receiving unit to electrically connect said first tab and said third tab by placing a fuse therebetween.

8. The electrical connector housing according to claim 4, wherein
said relay system comprises a second relay terminal having first and second sections, and
said first tab and said second tab being electrically connectable by engaging said first tab with said first section and said second tab with said second section, respectively.

9. The electrical connector housing according to claim 5, wherein
said relay system comprises a second relay terminal having first and second sections, and
said first tab and said second tab being electrically connectable by engaging said first tab with said first section and said second tab with said second section, respectively.

10. The electrical connector housing according to claim 8, wherein said first and second sections of said second relay terminal comprise a press-fit portion.

11. The electrical connector housing according to claim 9, wherein said first and second sections of said second relay terminal comprise a press-fit portion.

12. The electrical connector housing according to claim 8, wherein
said electrical connector housing comprises a first shell and a second shell,
said first shell comprises an internal face carrying a terminal-fixing unit, and
said second relay terminal is fixed thereto.

13. The electrical connector housing according to claim 9, wherein
said electrical connector housing comprises a first shell and a second shell,
said first shell comprises an internal face carrying a terminal-fixing unit, and
said second relay terminal is fixed thereto.

14. The electrical connector housing according to claim 6, wherein
said housing comprises an axis along which said first shell and said second shell are superposed,
said power distributor panel has a substantially parallelepipedic shape and is arranged in the direction parallel to said axis, and
said unit comprising laminated busbars has a substantially parallelepipedic shape and is arranged perpendicularly to said power distributor panel.

15. The electrical connector housing according to claim 7, wherein
said housing comprises an axis along which said first shell and said second shell are superposed,
said power distributor panel has a substantially parallelepipedic shape and is arranged in the direction parallel to said axis, and
said unit comprising laminated busbars has a substantially parallelepipedic shape and is arranged perpendicularly to said power distributor panel.

16. The electrical connector housing according to claim 12, wherein
said housing comprises an axis along which said first shell and said second shell are superposed,
said power distributor panel has a substantially parallelepipedic shape and is arranged in the direction parallel to said axis, and
said unit comprising laminated busbars has a substantially parallelepipedic shape and is arranged perpendicularly to said power distributor panel.

17. The electrical connector housing according to claim 13, wherein
said housing comprises an axis along which said first shell and said second shell are superposed,
said power distributor panel has a substantially parallelepipedic shape and is arranged in the direction parallel to said axis, and
said unit comprising laminated busbars has a substantially parallelepipedic shape and is arranged perpendicularly to said power distributor panel.

18. A system for cabling a vehicle comprising an electrical connector housing comprising:
a power distributor panel comprising first and second sidewalls and a printed circuit board with first and second faces; and
at least one unit comprising laminated busbars connected to a power source circuit,
said first face comprising conductors and at least one semiconductor switching element,
said second face comprising at least one busbar fixed thereto,
wherein said at least one busbar connects to a first connecting portion and said at least one unit connects to a second connecting portion, said first and second connecting portions being electrically connectable via a relay system.

19. A method for cabling a vehicle comprising the steps of:
preparing an electrical connector housing comprising a power distributor panel including first and second sidewalls, and at least one unit comprising laminated busbars connected to a power source circuit;
providing said power distributor panel with a printed circuit board having first and second faces;
providing said first face with conductors and at least one semiconductor switching element,
providing said second face with at least one busbar fixed thereto; and
providing said at least one busbar with a first connecting portion and said at least one unit with a second connecting portion; whereby said first and second connecting portions are electrically connectable via a relay system.

* * * * *